(12) United States Patent
Atanakovic et al.

(10) Patent No.: US 7,968,384 B2
(45) Date of Patent: Jun. 28, 2011

(54) STACKED TRANSISTORS AND PROCESS

(76) Inventors: Petar B. Atanakovic, Palo Alto, CA (US); Michael Lebby, Apache Junction, AZ (US)

( * ) Notice: Subject to any disclaimer, the term of this patent is extended or adjusted under 35 U.S.C. 154(b) by 0 days.

(21) Appl. No.: 12/534,011

(22) Filed: Jul. 31, 2009

(65) Prior Publication Data
US 2009/0291535 A1    Nov. 26, 2009

Related U.S. Application Data

(62) Division of application No. 11/188,081, filed on Jul. 22, 2005, now Pat. No. 7,579,623.

(51) Int. Cl.
*H01L 21/00* (2006.01)
*H01L 21/84* (2006.01)

(52) U.S. Cl. .......... 438/152; 438/245; 438/341

(58) Field of Classification Search .......... 438/152, 438/245, 341
See application file for complete search history.

(56) References Cited

U.S. PATENT DOCUMENTS

| | | | | |
|---|---|---|---|---|
| 4,479,297 A | * | 10/1984 | Mizutani et al. | 438/152 |
| 4,498,226 A | * | 2/1985 | Inoue et al. | 438/152 |
| 4,797,723 A | * | 1/1989 | Nishimura et al. | 257/74 |
| 4,902,642 A | * | 2/1990 | Mao et al. | 438/480 |
| 4,927,779 A | * | 5/1990 | Dhong et al. | 438/153 |
| 6,707,088 B2 | * | 3/2004 | Fishburn | 257/296 |
| 2003/0089954 A1 | * | 5/2003 | Sashida | 257/369 |
| 2003/0183885 A1 | * | 10/2003 | Nishikawa et al. | 257/410 |
| 2003/0218223 A1 | * | 11/2003 | Nishiyama et al. | 257/410 |
| 2004/0012022 A1 | * | 1/2004 | Wu | 257/68 |
| 2004/0070312 A1 | * | 4/2004 | Penunuri et al. | 310/313 A |
| 2004/0217404 A1 | * | 11/2004 | Itokawa et al. | 257/303 |
| 2006/0001111 A1 | * | 1/2006 | Tsuchiya et al. | 257/410 |

* cited by examiner

*Primary Examiner* — Eugene Lee
*Assistant Examiner* — Anthony Ho
(74) *Attorney, Agent, or Firm* — Parsons & Goltry; Robert A. Parsons; Michael W. Goltry

(57) ABSTRACT

A method of horizontally stacking transistors on a common semiconductor substrate is initiated by providing a single crystal, generally silicon, semiconductor substrate. A plurality of transistors are formed on the single crystal semiconductor substrate and encapsulated in an insulating layer, such as silicon dioxide. One or more openings are formed through the insulating layer between the plurality of transistors so as to expose a surface of the single crystal semiconductor substrate. A layer of single crystal rare earth insulator material is epitaxially grown on the exposed surface of the single crystal semiconductor substrate. A layer of single crystal semiconductor material, generally silicon, is epitaxially grown on the layer of single crystal rare earth insulator material. An intermixed transistor is formed on the layer of single crystal semiconductor material.

12 Claims, 2 Drawing Sheets

STACKED TRANSISTORS AND PROCESS

CROSS-REFERENCE TO RELATED APPLICATIONS

This application is a divisional application of currently pending U.S. application Ser. No. 11/188,081, filed 22 Jul. 2005.

FIELD OF THE INVENTION

This invention relates to transistors, and especially to multiple transistors horizontally stacked and the fabrication process.

BACKGROUND OF THE INVENTION

Complimentary metal oxide semiconductor (CMOS) structures are the core active elements of modern electronics. Undoubtedly, the major material enabling features of Si CMOS are the superb quality of the native silicon dioxide ($SiO_2$), $Si/SiO_2$ interface and high crystalline perfection of the Si substrates. The field effect transistor (FET) implemented as CMOS is scalable. That is, speed and complexity improves with decreasing device feature sizes. This concept makes CMOS architecture a powerful methodology. Deep submicron room-temperature bulk Si CMOS is presently the main technology used for ultra large scale integrated circuits (ULSICs).

Continued scaling of current CMOS architecture is reaching the limits of the material properties of both the $SiO_2$ gate dielectric and bulk Si substrate. Silicon-on-insulator (SOI) substrates offer solutions to both ULSI scaling and high performance wireless architectures. High frequency ULSI requires SOI for reduction in the number of processing steps, reduction of substrate leakage current coupling between FET's, reducing parasitic capacitances and latchup, formation of shallow junctions, isolation of clock noise and functional regions on chip, etc. SOI CMOS offers a 20-35% performance gain over conventional bulk Si CMOS. However, silicon-on-insulator (SOI) substrates are very difficult to produce by most traditional methods.

A solution to the problem of manufacturing silicon-on-insulator (SOI) substrates is disclosed in a copending United States Patent application entitled "Transistor and In-situ Fabrication Process", filed March 2005, bearing Ser. No. 11/053,785, (applicant's identifying designation Trans A5), and incorporated herein by reference.

Further, many integrated circuits, including ULSICs, include transistors of different types (e.g. switching transistors such as FETs and the like, bipolar transistors, amplifiers) and different conductivities (e.g. n-p-n or p-np). In most instances many additional steps are required to mix various types and conductivities and in some processes it is virtually impossible.

It would be highly advantageous, therefore, to remedy the foregoing and other deficiencies inherent in the prior art.

Accordingly, it is an object of the present invention to provide a new and improved method of horizontally stacking transistors on a semiconductor substrate.

Another object of the invention is to provide new and improved stacked or integrated transistors and transistor circuits on a common substrate.

Another object of the invention is to provide new and improved method of horizontally stacking transistors of different type and conductivity on a common semiconductor substrate.

Another object of the invention is to provide new and improved method of interconnecting horizontally stacked transistors of different type and conductivity on a common semiconductor substrate.

SUMMARY OF THE INVENTION

Briefly, to achieve the desired objects of the instant invention in accordance with a preferred embodiment thereof, a method of horizontally stacking transistors on a common semiconductor substrate is initiated by providing a single crystal, generally silicon, semiconductor substrate. A plurality of transistors are formed on the single crystal semiconductor substrate and encapsulated in an insulating layer, such as silicon dioxide. One or more openings are formed through the insulating layer between the plurality of transistors so as to expose a surface of the single crystal semiconductor substrate. A layer of single crystal rare earth insulator material is epitaxially grown on the exposed surface of the single crystal semiconductor substrate. A layer of single crystal semiconductor material, generally silicon, is epitaxially grown on the layer of single crystal rare earth insulator material. An intermixed transistor is formed on the layer of single crystal semiconductor material.

In a specific embodiment of a method of horizontally stacking transistors on a common semiconductor substrate the single crystal semiconductor substrate; is provided and a plurality of transistors are formed on thereon. The plurality of transistors are encapsulated in an insulating layer and at least one opening is formed through the insulating layer between the plurality of transistors so as to expose a surface of the single crystal semiconductor substrate. At least one layer combination of a single crystal rare earth conductive layer and a single crystal rare earth insulating layer is epitaxially grown on the exposed surface of the single crystal semiconductor substrate. Intermixed transistors can then be formed by epitaxially growing a layer of single crystal semiconductor material on the layer combination and/or the layer combination can be used to interconnect portions of the plurality of transistors or to form inactive components, such as capacitors and inductors.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF PREFERRED EMBODIMENTS

Figure 1:
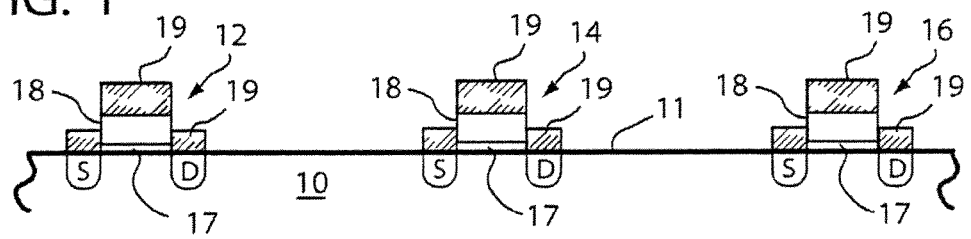
FIGS. 1-5 are simplified sectional views illustrating a series of steps in a process of horizontally stacking transistors on a common substrate in accordance with the present invention.

Turning now to the drawings, attention is first directed to FIG. 1, which illustrates a simplified sectional view of an interim step in a process for horizontally stacking transistors on a common substrate. A common substrate 10 is illustrated that, in this example, includes single crystal silicon. It should be understood that substrate 10 is, under normal manufacturing procedures, a silicon wafer, although any size substrate or portion of a wafer could be used in the following procedures, if desired, and all such wafers, substrates, and portions may be referred to herein as a 'substrate for convenience of understanding.

Further, while substrate 10 is illustrated only as a layer of single crystal silicon for convenience, it may be a silicon-on insulator (SOI) substrate as described in the above identified copending application. Also, in some applications one or more buried conductive layers may be included as ground plane and signal plane, as described in copending United States Patent application entitled "Signal and/or Ground Planes with Double Buried Insulator Layers and Fabrication Process", filed April 2005, bearing Ser. No. 11/121,737 (applicant's identifying designation Trans A8), and incorporated herein by reference.

Three transistors 12, 14, and 16 are formed on upper surface 11 of substrate 10 using standard fabrication techniques well known in the art. In this specific example, transistors 12, 14, and 16 are all FETs or switching transistors commonly used in integrated circuits, such as CMOS circuits and the like. Each transistor 12, 14, and 16 is illustrated with a source area S and a drain area D implanted or diffused (generically referred to as doping) into substrate 10. A thin gate insulator 17 is positioned over the channel area between source area S and drain area D and a gate stack 18 is formed on top of gate insulator 17. Metallization 19 is deposited on substrate surface 11 above both source area S and drain area D and on the upper surface of gate stack 18 to provide for external connections.

Figure 2:
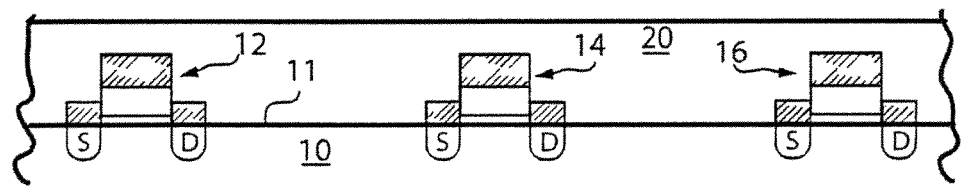

Referring additionally to FIG. 2, substrate 10, along with transistors 12, 14, and 16 are encapsulated in an insulating or dielectric layer 20. Insulating layer 20 can be a layer of silicon dioxide that is grown in any of the well known methods or it can be something as simple and easy to remove as any of the well known photo resists used in various etching and masking processes. In many instances whatever material is used in insulating layer 20 will be deposited in a uniform thickness and it may be desirable to mechanically process the surface to provide the flat surface illustrated in FIG. 2.

Figure 3:
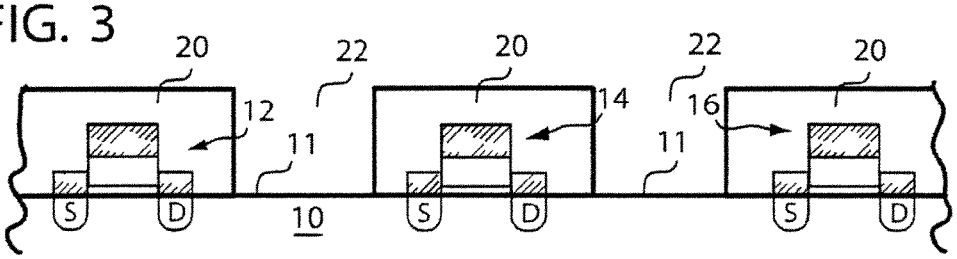

Referring additionally to FIG. 3, openings 22 are formed in insulating layer 20 between or adjacent transistors 12, 14, and 16. Here it should be understood that the positioning of opening 22 may depend in large part on the specific circuit being formed, the original position of transistors 12, 14, and 16 and the ultimate application of the overall circuit. However, for convenience of understanding, openings 22 are illustrated between transistors 12 and 14 and between transistors 14 and 16 to better illustrate the stacking possibilities. It should be specifically noted that openings 22 are formed so that the upper surface of single crystal substrate 10 is exposed.

Figure 4:
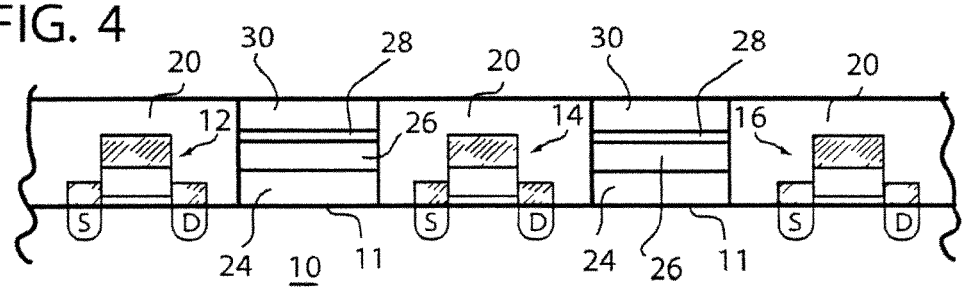

Turning now to FIG. 4, the structure of FIG. 3 is illustrated with a plurality of layers of single crystal material grown in openings 22. In this embodiment and only for purposes of explanation, a first layer 24 of single crystal rare earth insulating material (e.g. rare earth oxide, rare earth nitride, rare earth oxynitride, etc.) is epitaxially grown directly on the exposed surface of substrate 10. Since substrate 10 is single crystal material, in this example silicon, layer 24 can be epitaxially grown as a single crystal material and lattice matched to the silicon substrate. The above copending application (i.e. "Transistor and In-situ Fabrication Process") can be referred to for a more complete description of this process. Here it will be noted that the growth of layer 24 of single crystal material will be limited to the exposed areas of single crystal substrate 10 (i.e. selective area growth) and any material grown on, for example, insulating layer 20, will be amorphous and easily removed, if desired.

While any of the materials known as 'rare earths' can be used in the formation of single crystal rare earth insulating material layer 24, two preferred examples are Erbium (Er) and Ytterbium (Yb). Other typical examples of rare earth materials that can be used in this application are described in a copending United States patent application entitled "Rare Earth-Oxides, Rare Earth-Nitrides, Rare Earth-Phosphides and Ternary Alloys With Silicon", filed on Dec. 28, 2004, and bearing serial number, which is a conversion of United States provisional application No. 60/533,378, filed 29 Dec. 2003 and bearing the same title, incorporated herein by reference. All of the above described materials (e.g. rare earth oxide, rare earth nitride, rare earth oxynitride, etc.) are referred to in this disclosure generally as "rare earth insulators" or as "rare earth insulating materials".

An active layer 26 of single crystal silicon is grown on the surface of single crystal rare earth insulating material layer 24. Here it will be understood that active layer 26 will serve as a substrate for additional transistors intermixed or stacked between transistors 12, 14, and/or 16. For purposes of differentiating the additional transistors from transistors 12, 14, and 16, the additional transistors will be referred to herein as 'intermixed transistors'. Further, intermixed transistors can be formed on active layer 26 in a variety of processes, including the process used to form transistors 12, 14, and 16, if desired. However, the following method is described because the intermixed transistors can be formed in-situ to substantially reduce the time and labor involved.

A very thin gate insulating layer 28 of single crystal rare earth insulating material is epitaxially grown on the surface of active layer 26. A gate stack 30, including one or more layers of material for contacting gate insulating layer 28, is epitaxially grown on gate insulating layer 28. In a preferred embodiment gate stack 30 is grown as single crystal material but it will be understood that a standard gate can be formed if desired. For an example of reasons for growing single crystal material in the gate stack, refer to the copending application entitled "FET Gate Structure and Fabrication Process", filed April 2005, bearing Ser. No. 11/068,222 (applicant's identifying designation Trans A6), incorporated herein by reference.

Figure 5:
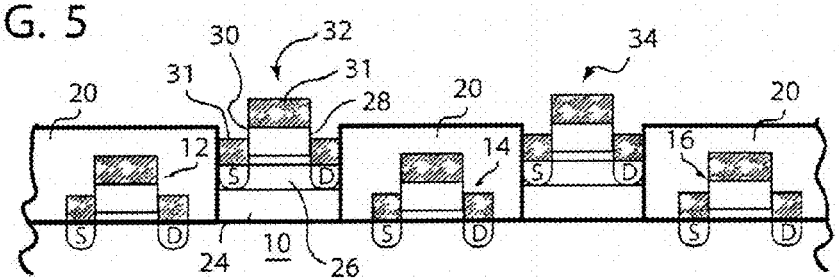

Once single crystal layers 24, 26, 28, and 30 are formed, layers 30 and 28 can be etched to provide an exposed surface of active layer 26 on opposite sides of gate insulating layer 28 and gate stack 30. A source area S and a drain area D can then be implanted or diffused into active layer 26, as illustrated in FIG. 5. Metal contacts 31 can then be deposited on source S, drain D, and gate stack 30 using any of the well known metallization techniques. Thus, two intermixed transistors 32 and 34 are stacked between transistors 12, 14, and 16.

It should be understood that a description for the fabrication of a FET is used to simplify the description for better understanding. However, other transistors or semiconductor products can be formed in openings 22, if desired. Also, it should be noted that single crystal substrate 10, which forms the active layers or channels for transistors 12, 14, and 16, and active layer 26 of transistors 32 and 34 are different layers of materials and can be doped differently, for example, to provide transistors with different conductivity. As an example, the structure illustrated in FIG. 5 is valuable in the formation of CMOS circuits because complementary transistors are easily fabricated and connected. Also, intermixed transistors 32 and 34 are formed with a buried insulator layer (i.e. single crystal rare earth insulating material layer 24) under active layer 26 so that an SOI configuration is provided. It will be understood that substrate 10 could be formed in a similar fashion on a buried single crystal rare earth insulating material layer so that 26 so that an SOI configuration is provided for transistors 12, 14, and 16, if desired.

Figure 6:
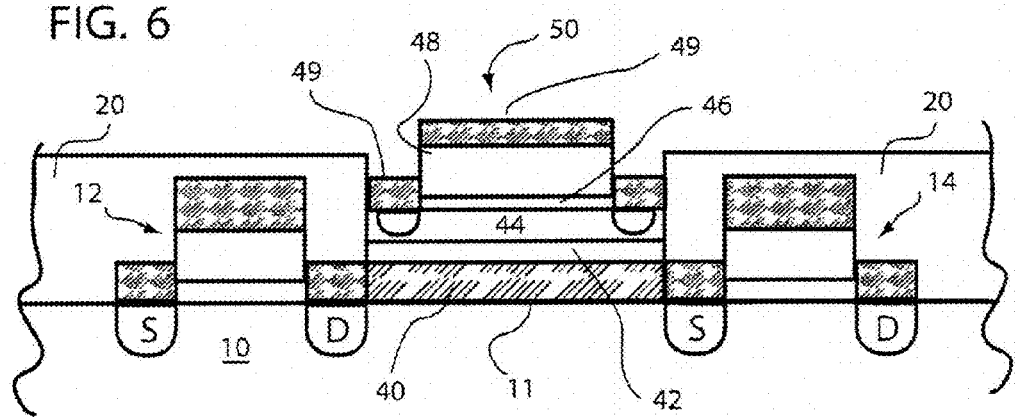
FIG. 6 is an enlarged simplified sectional view of another embodiment of stacked transistors formed in accordance with the present invention.

Turning now to FIG. 6, an enlarged view of another embodiment is illustrated in which the structure of FIG. 3 is used as a starting point. In this embodiment, a conductive layer 40 is formed on surface 11 of substrate 10 in opening 22. Conductive layer 40 can be, for example, a layer of rare earth silicide epitaxially deposited in single crystal form. An insulating layer 42 of single crystal rare earth insulating material (e.g. rare earth oxide, rare earth nitride, rare earth oxynitride, etc.) is epitaxially grown directly on the exposed surface of conductive layer 40. In this disclosure rare earth conductive layer 40 and rare earth insulating layer 42 are considered a 'layer combination', with rare earth conductive layer 40 forming a buried conductive layer and rare earth insulating layer 42 forming a buried oxide (BOX) layer. An active layer 44 of single crystal silicon is grown directly on the surface of single crystal rare earth insulating layer 42. A gate insulating layer 46 of single crystal rare earth insulating material (e.g. rare earth oxide, rare earth nitride, rare earth oxynitride, etc.) is epitaxially grown directly on the exposed surface of active layer 44 and a gate stack 48 is epitaxially grown on gate insulating layer 46.

Once single crystal layers 40, 42, 44, 46, and 48 are formed, layers 48 and 46 can be etched to provide an exposed surface of active layer 44 on opposite sides of gate insulating layer 46 and gate stack 48. A source area S and a drain area D can then be implanted or diffused into active layer 44. Metal contacts 49 can then be deposited on source S, drain D, and gate stack 48 using any of the well known metallization techniques. Thus, an intermixed transistor 50 is stacked between transistors 12 and 14. Also, buried conductive layer 40 can be used to interconnect various components within the circuit. The connection of the drain D of transistor 12 to the source S of transistor 14 by buried conductive layer 40 is illustrated only as an example of the usefulness of the buried conductive layer.

Figure 7:
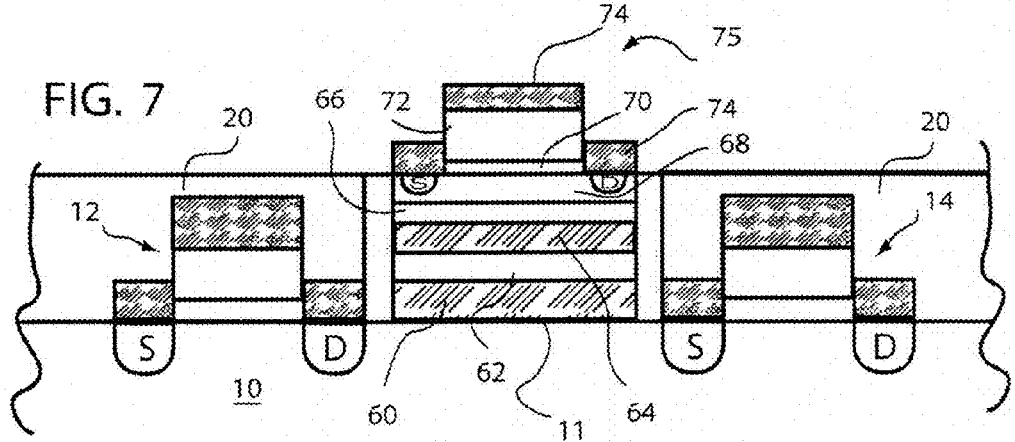
FIG. 7 is an enlarged simplified sectional view of another embodiment of stacked transistors formed in accordance with the present invention.

Turning now to FIG. 7, an enlarged view of another embodiment is illustrated in which the structure of FIG. 3 is used as a starting point. In this embodiment, a first conductive layer 60 is formed on surface 11 of substrate 10 in opening 22. First conductive layer 60 can be, for example, a layer of rare earth silicide epitaxially deposited in single crystal form. An insulating layer 62 of single crystal rare earth insulating material (e.g. rare earth oxide, rare earth nitride, rare earth oxynitride, etc.) is epitaxially grown directly on the exposed surface of conductive layer 60. A second conductive layer 64 is formed on the surface insulating layer 62 in opening 22. Second conductive layer 62 can be, for example, a layer of rare earth silicide epitaxially deposited in single crystal form. A second insulating layer 66 of single crystal rare earth insulating material (e.g. rare earth oxide, rare earth nitride, rare earth oxynitride, etc.) is epitaxially grown directly on the exposed surface of second conductive layer 64. Rare earth conductive layer 60 and rare earth insulating layer 62 form a first layer combination with rare earth conductive layer 64 and rare earth insulating layer 66 forming a second layer combination. Here it will be understood that any desired number of layer combinations could be formed, depending upon the application, desired number of interconnects, desired components, etc.

An active layer 68 of single crystal silicon is grown directly on the surface of single crystal rare earth insulating layer 66. A gate insulating layer 70 of single crystal rare earth insulating material (e.g. rare earth oxide, rare earth nitride, rare earth oxynitride, etc.) is epitaxially grown directly on the exposed surface of active layer 68 and a gate stack 72 is epitaxially grown on gate insulating layer 70. Once single crystal layers 60, 62, 64, 66, 68, 70, and 72 are formed, layers 72 and 70 can be etched to provide an exposed surface of active layer 68 on opposite sides of gate insulating layer 70 and gate stack 72. A source area S and a drain area D can then be implanted or diffused into active layer 68. Metal contacts 74 can then be deposited on source S, drain D, and gate stack 72 using any of the well known metallization techniques. Thus, an intermixed transistor 75 is stacked between transistors 12 and 14.

In this embodiment buried conductive layers 60 and 62 can be used to interconnect components and/or to produce inactive components, such as capacitors or inductors. One of conductive layers 60 or 62, for example, could be connected to a terminal of transistor 12 and the other of conductive layers 60 or 62 could be connected to a second transistor (e.g. transistor 14) to provide capacitive coupling therebetween. In a similar fashion, additional buried conductive layers could be provided for other connections or components.

Thus, new and improved semiconductor components are disclosed that are fabricated using the new and improved method of fabricating semiconductor components in-situ (i.e. without removing the structure from the epitaxial chamber) and in a continuous integrated sequence. The new and improved fabrication method does not use ion implantation of oxygen or nitrogen (or even both) through the surface of a bulk Si substrate or the bond and etch back technology which combines implantation with wafer bonding. The new and improved fabrication method utilizes epitaxially grown rare earth insulating materials and epitaxially grown semiconductor materials with improved characteristics and with fewer or no impurities and imperfections. Also, the new and improved fabrication method is easier and less work concentrated then prior art SOI methods.

Thus, new and improved stacked or integrated transistors and transistor circuits on a common substrate are disclosed. Also, a new and improved method of horizontally stacking transistors of different type and conductivity on a common semiconductor substrate is disclosed. The new and improved method also includes interconnecting horizontally stacked transistors of different type and conductivity on a common semiconductor substrate.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of horizontally stacking or integrating transistors on a common semiconductor substrate comprising the steps of:

providing a single crystal semiconductor substrate;

forming a plurality of transistors on the single crystal semiconductor substrate;

encapsulating the plurality of transistors in an insulating layer;

forming an opening through the insulating layer between the plurality of transistors, the opening exposing a surface of the single crystal semiconductor substrate;

epitaxially growing a first layer of single crystal rare earth insulator material on the exposed surface of the single crystal semiconductor substrate, the first layer of single crystal rare earth insulator material being chosen to be substantially lattice matched with the single crystal semiconductor substrate;

epitaxially growing a first layer of single crystal semiconductor material on the first layer of single crystal rare earth insulator material, the first layer of single crystal semiconductor material being substantially lattice matched with the first layer of single crystal rare earth insulator material; and forming an intermixed transistor on the first layer of single crystal semiconductor material.

2. A method as claimed in claim 1 wherein the step of forming the opening includes forming a plurality of openings, and the step of forming the intermixed transistor includes forming a plurality of intermixed transistors, one each in each of the plurality of openings.

3. A method as claimed in claim 2 wherein the step of forming the plurality of intermixed transistors includes forming intermixed transistors with one of different type and different conductivity from the plurality of transistors.

4. A method as claimed in claim 1 wherein the step of providing the single crystal semiconductor substrate includes providing a silicon substrate and the step of epitaxially growing the first layer of single crystal semiconductor material includes epitaxially growing a layer of single crystal silicon.

5. A method as claimed in claim 1 wherein the step of forming the intermixed transistor includes the steps of epitaxially growing a gate insulator layer of rare earth insulating material on the surface of the first layer of single crystal semiconductor material, epitaxially growing a gate stack layer on the gate insulator layer, etching the gate stack layer and the gate insulator layer to define a transistor gate with source and drain areas on opposite sides thereof, doping the source and drain areas to form a source and drain, and depositing metal contacts on the source, drain and gate stack.

6. A method of horizontally stacking or integrating transistors on a common semiconductor substrate comprising the steps of:

providing a single crystal semiconductor substrate;

forming a plurality of transistors on the single crystal semiconductor substrate;

encapsulating the plurality of transistors in an insulating layer;

forming an opening through the insulating layer between the plurality of transistors, the opening exposing a surface of the single crystal semiconductor substrate; and epitaxially growing at least one layer combination of a single crystal rare earth conductive layer and a single crystal rare earth insulating layer on the exposed surface of the single crystal semiconductor substrate including epitaxially growing a gate insulator layer of rare earth insulating material on the surface of the first layer of single crystal semiconductor material, epitaxially growing a gate stack layer on the gate insulator layer, etching the gate stack layer and the gate insulator layer to define a transistor gate with source and drain areas on opposite sides thereof, doping the source and drain areas to form a source and drain, and depositing metal contacts on the source, drain and gate stack.

7. A method as claimed in claim 6 further including the steps of epitaxially growing a first layer of single crystal semiconductor material on the layer combination, and forming an intermixed transistor on the first layer of single crystal semiconductor material.

8. A method as claimed in claim 7 wherein the step of forming the opening includes forming a plurality of openings, and the step of forming the intermixed transistor includes forming a plurality of intermixed transistors, one each in each of the plurality of openings.

9. A method as claimed in claim 8 wherein the step of forming the plurality of intermixed transistors includes forming intermixed transistors with one of different type and different conductivity from the plurality of transistors.

10. A method as claimed in claim 7 wherein the step of providing the single crystal semiconductor substrate includes providing a silicon substrate and the step of epitaxially growing the first layer of single crystal semiconductor material includes epitaxially growing a layer of single crystal silicon.

11. A method as claimed in claim 6 further including the step of using the single crystal rare earth conductive layer of the layer combination to interconnect portions of the plurality of transistors.

12. A method as claimed in claim 6 further including the step of using the single crystal rare earth conductive layer of the layer combination to form inactive components of a circuit.

* * * * *